United States Patent
Lee et al.

(10) Patent No.: US 9,653,327 B2
(45) Date of Patent: May 16, 2017

(54) METHODS OF REMOVING A MATERIAL LAYER FROM A SUBSTRATE USING WATER VAPOR TREATMENT

(75) Inventors: Kwangduk Douglas Lee, Redwood City, CA (US); Sudha Rathi, San Jose, CA (US); Chiu Chan, Foster City, CA (US); Martin J. Seamons, San Jose, CA (US); Bok Heon Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1118 days.

(21) Appl. No.: 13/291,286

(22) Filed: Nov. 8, 2011

(65) Prior Publication Data

US 2012/0285481 A1 Nov. 15, 2012

Related U.S. Application Data

(60) Provisional application No. 61/485,534, filed on May 12, 2011.

(51) Int. Cl.
| | |
|---|---|
| *H01L 21/3065* | (2006.01) |
| *H01L 21/67* | (2006.01) |
| *C23C 16/02* | (2006.01) |
| *H01L 21/02* | (2006.01) |

(Continued)

(52) U.S. Cl.
CPC ...... *H01L 21/6704* (2013.01); *C23C 16/0245* (2013.01); *H01L 21/02063* (2013.01); *H01L 21/31122* (2013.01); *H01L 21/31144* (2013.01); *H01L 21/76814* (2013.01)

(58) Field of Classification Search
None
See application file for complete search history.

(56) References Cited

U.S. PATENT DOCUMENTS

| | | | |
|---|---|---|---|
| 4,975,144 A | 12/1990 | Yamazaki et al. | |
| 5,262,262 A | 11/1993 | Yagi et al. | |
| 5,382,316 A * | 1/1995 | Hills et al. | 216/67 |

(Continued)

FOREIGN PATENT DOCUMENTS

| | | |
|---|---|---|
| JP | 05-217965 | 8/1993 |
| KR | 10-2007-0081649 A | 8/2007 |

OTHER PUBLICATIONS

International Search Report, PCT/US2012/035659 dated Feb. 7, 2013.

(Continued)

*Primary Examiner* — Michael Kornakov
*Assistant Examiner* — Ryan Coleman
(74) *Attorney, Agent, or Firm* — Patterson + Sheridan, LLP

(57) ABSTRACT

Embodiments of the invention generally relate to methods of removing and/or cleaning a substrate surface having different material layers disposed thereon using water vapor plasma treatment. In one embodiment, a method for cleaning a surface of a substrate includes positioning a substrate into a processing chamber, the substrate having a dielectric layer disposed thereon forming openings on the substrate, exposing the dielectric layer disposed on the substrate to water vapor supplied into the chamber to form a plasma in the water vapor, maintaining a process pressure in the chamber at between about 1 Torr and about 120 Torr, and cleaning the contact structure formed on the substrate.

11 Claims, 5 Drawing Sheets

(51) Int. Cl.
*H01L 21/311* (2006.01)
*H01L 21/768* (2006.01)

(56) References Cited

U.S. PATENT DOCUMENTS

| | | |
|---|---|---|
| 5,461,003 A | 10/1995 | Havemann et al. |
| 5,759,913 A | 6/1998 | Fulford, Jr. et al. |
| 5,789,320 A | 8/1998 | Andricacos et al. |
| 5,830,332 A | 11/1998 | Babich et al. |
| 5,866,920 A | 2/1999 | Matsumoto et al. |
| 5,882,830 A | 3/1999 | Visser et al. |
| 5,900,288 A | 5/1999 | Kuhman et al. |
| 5,930,655 A | 7/1999 | Cooney, III et al. |
| 5,981,000 A | 11/1999 | Grill et al. |
| 5,986,344 A | 11/1999 | Subramanion et al. |
| 6,008,140 A | 12/1999 | Ye et al. |
| 6,030,901 A | 2/2000 | Hopper et al. |
| 6,035,803 A | 3/2000 | Robles et al. |
| 6,043,167 A | 3/2000 | Lee et al. |
| 6,054,379 A | 4/2000 | Yau et al. |
| 6,057,226 A | 5/2000 | Wong |
| 6,064,118 A | 5/2000 | Sasaki |
| 6,066,577 A | 5/2000 | Cooney, III et al. |
| 6,080,529 A | 6/2000 | Ye et al. |
| 6,098,568 A | 8/2000 | Raoux et al. |
| 6,140,224 A | 10/2000 | Lin |
| 6,140,226 A | 10/2000 | Grill et al. |
| 6,143,476 A | 11/2000 | Ye et al. |
| 6,153,935 A | 11/2000 | Edelstein et al. |
| 6,165,890 A | 12/2000 | Kohl et al. |
| 6,183,930 B1 | 2/2001 | Ueda et al. |
| 6,184,572 B1 | 2/2001 | Mountsier et al. |
| 6,203,898 B1 | 3/2001 | Kohler et al. |
| 6,211,065 B1 | 4/2001 | Xi et al. |
| 6,214,637 B1 | 4/2001 | Kim et al. |
| 6,214,730 B1 | 4/2001 | Cooney, III et al. |
| 6,235,629 B1 | 5/2001 | Takenaka |
| 6,291,334 B1 | 9/2001 | Somekh |
| 6,316,347 B1 | 11/2001 | Chang et al. |
| 6,323,119 B1 | 11/2001 | Xi et al. |
| 6,331,380 B1 | 12/2001 | Ye et al. |
| 6,333,255 B1 | 12/2001 | Sekiguchi |
| 6,346,747 B1 | 2/2002 | Grill et al. |
| 6,358,573 B1 | 3/2002 | Raoux et al. |
| 6,358,804 B2 | 3/2002 | Kobayashi et al. |
| 6,380,106 B1 | 4/2002 | Lim et al. |
| 6,413,852 B1 | 7/2002 | Grill et al. |
| 6,423,384 B1 | 7/2002 | Khazeni et al. |
| 6,428,894 B1 | 8/2002 | Babich et al. |
| 6,458,516 B1 | 10/2002 | Ye et al. |
| 6,500,357 B1 * | 12/2002 | Luo et al. ............ 216/79 |
| 6,541,397 B1 | 4/2003 | Bencher |
| 6,541,842 B2 | 4/2003 | Meynen et al. |
| 6,573,030 B1 | 6/2003 | Fairbairn et al. |
| 6,596,627 B2 | 7/2003 | Mandal |
| 6,624,064 B1 | 9/2003 | Sahin et al. |
| 6,635,583 B2 | 10/2003 | Bencher et al. |
| 6,841,341 B2 | 1/2005 | Fairbairn et al. |
| 6,852,647 B2 | 2/2005 | Bencher |
| 6,884,733 B1 | 4/2005 | Dakshina-Murthy et al. |
| 6,939,794 B2 | 9/2005 | Yin et al. |
| 7,407,893 B2 | 8/2008 | Seamons et al. |
| 7,576,441 B2 | 8/2009 | Yin et al. |
| 7,638,440 B2 | 12/2009 | Wang et al. |
| 8,337,950 B2 | 12/2012 | Nguyen et al. |
| 2001/0007788 A1 | 7/2001 | Chang et al. |
| 2002/0001778 A1 | 1/2002 | Latchford et al. |
| 2002/0045355 A1 | 4/2002 | Chong et al. |
| 2002/0086547 A1 | 7/2002 | Mui et al. |
| 2002/0090794 A1 | 7/2002 | Chang et al. |
| 2003/0091938 A1 | 5/2003 | Fairbairn et al. |
| 2003/0119307 A1 | 6/2003 | Bekiaris et al. |
| 2004/0038537 A1 | 2/2004 | Liu et al. |
| 2004/0229470 A1 | 11/2004 | Rui et al. |
| 2005/0202683 A1 | 9/2005 | Wang et al. |
| 2005/0260347 A1 | 11/2005 | Narwankar et al. |
| 2005/0287771 A1 | 12/2005 | Seamons et al. |
| 2006/0003582 A1 | 1/2006 | Roh |
| 2006/0019033 A1 * | 1/2006 | Muthukrishnan et al. 427/248.1 |
| 2006/0199393 A1 | 9/2006 | Lee et al. |
| 2006/0240656 A1 | 10/2006 | Ahn |
| 2007/0068558 A1 * | 3/2007 | Papanu et al. ............ 134/29 |
| 2008/0003824 A1 | 1/2008 | Padhi et al. |
| 2008/0057724 A1 * | 3/2008 | Kiehlbauch et al. ........ 438/706 |
| 2008/0230008 A1 * | 9/2008 | Paterson et al. ......... 118/723 E |
| 2008/0233755 A1 * | 9/2008 | Blais et al. .............. 438/710 |
| 2011/0108058 A1 | 5/2011 | Srivastava et al. |
| 2012/0285481 A1 | 11/2012 | Lee et al. |
| 2012/0285492 A1 | 11/2012 | Lee et al. |

OTHER PUBLICATIONS

PCT international search report and written opinion of PCT/US2012/063651 dated Mar. 20, 2013.

Office Action from Taiwan Application Serial No. 101141568 dated Oct. 27, 2016.

Office Action from Taiwan Patent Application No. 101141568 dated Jul. 13, 2016.

\* cited by examiner

METHODS OF REMOVING A MATERIAL LAYER FROM A SUBSTRATE USING WATER VAPOR TREATMENT

CROSS-REFERENCE TO RELATED APPLICATIONS

This application claims benefit of U.S. Provisional Application Ser. No. 61/485,534 filed May 12, 2011, which is incorporated by reference in their entirety.

BACKGROUND OF THE INVENTION

Field of the Invention

Embodiments of the invention generally relate to methods of removing a material layer from a semiconductor substrate, more particularly, to methods of removing a boron-carbon layer from a semiconductor substrate using a water vapor plasma treatment.

Description of the Related Art

Interconnect structures of integrated circuits and semiconductor devices are typically fabricated by forming a series of dielectric layers and conductive layers in order to create a three dimensional network of conductive layers separated by dielectric material. The interconnect structure may be fabricated using, for example, a damascene structure in which a dielectric layer such as a low k dielectric layer is formed atop one or more conductive plugs or sub-layers. In order to form an electrical connection to the conductive sub-layers, the dielectric is patterned and etched to define via openings therethrough. When forming openings in the dielectric layers, a photoresist layer or a hardmask layer is often used to assist transferring features and/or openings into the dielectric layer. Formation of the openings within the dielectric layer exposes a portion of the conductive line. Therefore, reliable formation of these interconnect features is an important factor in ensuring the quality, performance and reliability of devices formed on individual substrates and in each die.

The market for integrated circuits and semiconductor devices continually requires faster circuitry and greater circuit density, e.g., including millions of components on a single chip. As a result, the dimensions of the integrated circuit components shrink, and the choice of materials used to fabricate such components becomes increasingly important. For example, low resistivity metal interconnects, such as copper and aluminum, that provide conductive paths between the components on the integrated circuits, now require low dielectric constant layers, e.g., having a dielectric constant≤4, between the metal interconnects to provide insulating inter-metal layers that reduce capacitive coupling between adjacent metal lines, thereby enabling reliable performance at the same line widths.

Low k materials conventionally used as dielectric layers include undoped silicon glass (USG), fluorine-doped silicon glass (FSG), carbon doped silicon dioxide (SiOC), and polytetrafluoroethylene, among other materials, deposited as a film on a substrate. Before forming the conductive layer on the etching-defined dielectric layer, it is desirable to clean the top surface of the dielectric film to remove residual contaminants, such as native oxides and/or organic materials from etching and/or ashing processes. Removing contaminants reduces contact resistance and/or prevents adhesion loss at the interface of the conductive layer to be deposited.

A precleaning procedure may be used to remove contaminants from the dielectric film surface prior to deposition of the conductive layer. However, conventional cleaning process, such as wet cleaning process or other processes, used for precleaning the dielectric layer may damage or resputter the dielectric film surface or generate unwanted charged particles in the process chamber prior to the subsequent conductive layer deposition. As such, low k dielectric film cleaned by using conventional techniques may result in film degradation and defects. Additionally, carbon doped low k materials tend to experience carbon depletion or "k loss," in which the dielectric constant of the low k material is increased after exposure to the plasma used in the cleaning procedure. As a result, undesired cross-talk and RC delay become more problematic after the cleaning procedure.

Furthermore, for the photoresist layer and/or the hardmask layer utilized to transfer features and/or opening into the dielectric layer, it is desired to have a suitable removal process to clean or remove the photoresist layer and/or the hardmask layer without damaging the underlying dielectric layer or without adversely resulting in film degradation and defects in the dielectric layer. For example, boron-carbon films, such as a boron-carbon layer, have demonstrated superior patterning performance as compared to amorphous carbon when being used as a hardmask during an etching process. However, boron-carbon films are not easily stripped. Overly aggressive plasma removal process to remove boron carbon film may result in corrosion to dielectric materials, exposed metal surfaces or embedded metals also commonly found on semiconductor substrates, thereby undesirable resulting deteriorating the device structure and device performance failure.

In addition, as circuit densities increase for next generation devices, the widths of interconnects, such as vias, trenches, openings, contacts, gate structures and other features, as well as the dielectric materials therebetween, decrease to 45 nm and 32 nm dimensions, whereas the thickness of the dielectric layers remain substantially constant, with the result of increasing the aspect ratios of the features, such as deep contact structure, complicated high-k, metal gate film stack and/or three dimensional memory stack and the like. Many traditional cleaning processes have difficulty removing residuals from submicron structures where the aspect ratio exceeds 4:1 or with odd geometry.

Therefore, there is a need for an improved method of removing or cleaning a substrate surface.

SUMMARY OF THE INVENTION

Embodiments of the invention generally relate to methods of removing residual and/or cleaning a substrate surface disposed thereon using water vapor plasma treatment. In one embodiment, a method for cleaning a surface of a substrate includes positioning a substrate into a processing chamber, the substrate having a dielectric layer disposed thereon forming openings on the substrate, exposing the dielectric layer disposed on the substrate to water vapor supplied into the chamber to form a plasma in the water vapor, maintaining a process pressure in the chamber at between about 1 Torr and about 120 Torr, and cleaning the contact structure formed on the substrate.

In another embodiment, a method for cleaning a substrate surface includes positioning a substrate having a dielectric layer disposed thereon in a chamber, exposing the dielectric layer to water vapor supplied into the chamber to form a plasma in the water vapor, controlling a surface of the dielectric layer having a wetting angle less than about 40 degrees, and cleaning the dielectric layer from the substrate.

In yet another embodiment, a method for cleaning a processing chamber includes providing a processing chamber having boron-carbon containing residuals formed in an interior of the processing chamber, supplying water vapor generated from a water vapor generator coupled to the processing chamber into the processing chamber to form a plasma in the water vapor, and removing the boron-carbon containing residuals from the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to methods of removing and/or cleaning a substrate surface having a material layer disposed thereon using water vapor plasma treatment. In one embodiment, the material layer is a carbon containing layer. In another embodiment, the material layer is a boron-carbon containing layer. In yet another embodiment, the material layer may be any suitable material layers as needed. The methods may be used to remove a substrate surface having the material layer disposed thereon using water vapor plasma treatment. The material layer removal processes may also include an optional carbon containing material layer removal process prior to removal of the material layers. Embodiments of the invention may be practiced in the Producer® SE or Producer® GT chambers available from Applied Materials, Inc., of Santa Clara, Calif. It is contemplated that other chambers, including those produced by other manufacturers, may benefit from embodiments described herein.

Figure 1:
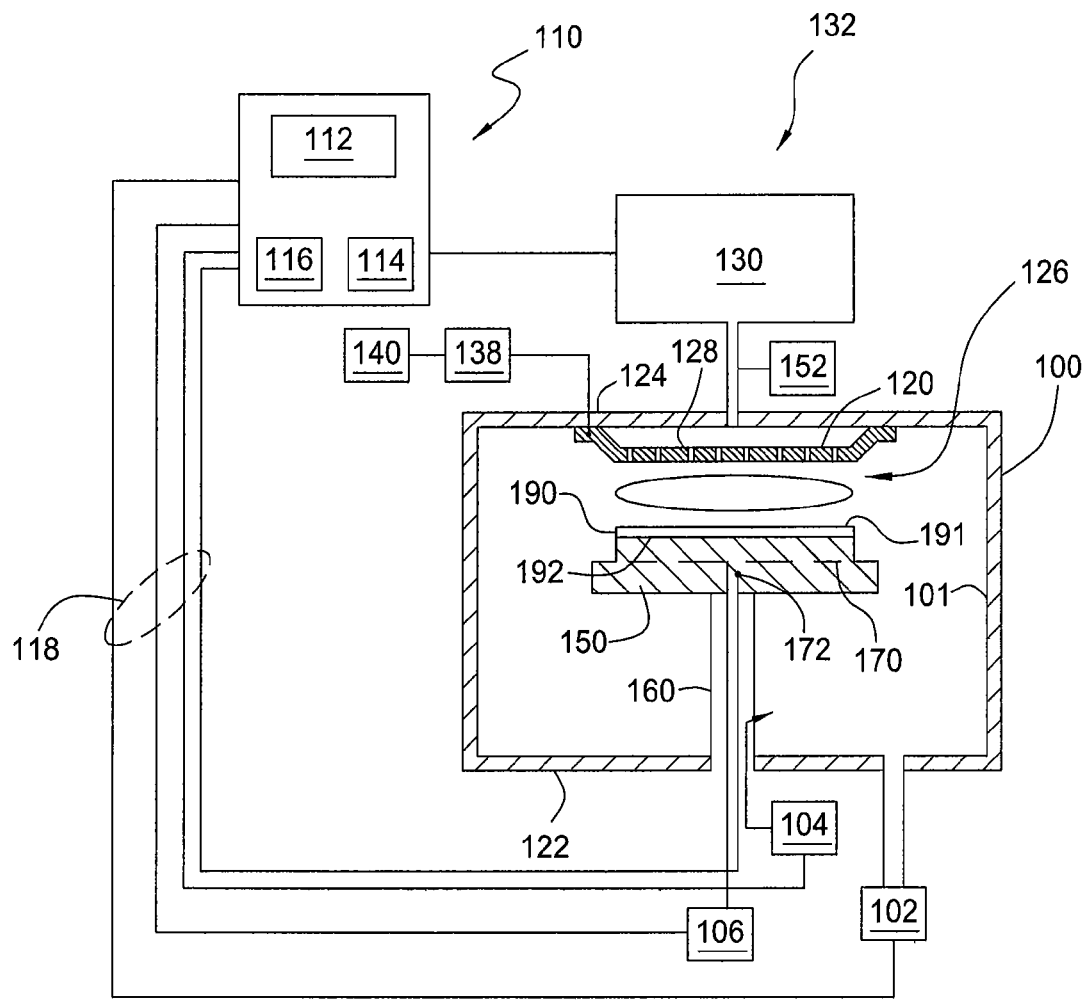
FIG. 1 depicts a schematic illustration of an apparatus that can be used for the practice of this invention.

FIG. 1 is a schematic representation of a substrate processing system 132 that can be used to perform the cleaning/removal process in accordance with embodiments of the present invention. Details of one example of a substrate processing system 132 that may be used to practice the invention is described in commonly assigned U.S. Pat. No. 6,364,954 issued on Apr. 2, 2002, to Salvador et. al., and is herein incorporated by reference. Other examples of systems that may be used to practice the invention include CENTURA®, and Producer® SE or Producer® GT deposition systems, all available from Applied Materials Inc., Santa Clara, Calif. It is contemplated that other processing system, including those available from other manufacturers, may be adapted to practice the invention.

The processing system 132 includes a process chamber 100 coupled to a gas panel 130 and a controller 110. The process chamber 100 generally includes a top 124, a side 101 and a bottom wall 122 that define an interior volume 126. A water vapor generating (WVG) system 152 is coupled to the processing system 132 that is in fluid communication to the interior volume 126 defined in the process chamber 132. The WVG system 152 generates ultra-high purity water vapor by means of a catalytic reaction of $O_2$ and $H_2$. Alternatively, the WVG system 152 may also generate water vapor by directly vaporizing water ($H_2O$) into water vapor as needed. In one embodiment, the $H_2$ and the $O_2$ each flow into the WVG system 152 at a rate in the range from about 1 sccm to about 30000 sccm. In the embodiment wherein an $O_2$ enriched water vapor is required, the flow of $O_2$ is the configured to be higher than the flow of $H_2$ and vise versa. Once a desired $H_2/O_2$ concentration is determined, each flow rate may be proportionately altered to adjust the outward flowing water vapor with the same or different $H_2/O_2$ concentration.

In one embodiment, the WVG system 152 has a catalyst-lined reactor or a catalyst cartridge in which water vapor is generated by means of a chemical reaction. The catalyst may include a metal or alloy, such as palladium, platinum, nickel, combinations thereof and alloys thereof. The ultra-high purity water is ideal for a cleaning process to eliminate undesired contamination or purity formed to the underlying dielectric layer disposed on the substrate 190. In one embodiment, to prevent unreacted $H_2$ from flowing downstream, $O_2$ is allowed to flow through the WVG system 152 for 5 seconds. Next, $H_2$ is allowed to enter the reactor for about 5 seconds. The catalytic reaction between $H_2$ and $O_2$ is instantaneous, so water vapor is generated immediately after the $H_2$ and $O_2$ reach the reactor. Regulating the flow of $H_2$ and $O_2$ allows the concentration to be precisely controlled at any point from 1% to 100% concentrations, that is, the water vapor may contain water, $H_2$, $O_2$ or combinations thereof. In one example, the water vapor contains water and $O_2$. In another example, the water vapor contains water and $H_2$. Similarly, by employing the same method of gas flow control, the amount of water vapor may also be regulated, yielding accurate and repeatable flows every time. While water vapor is usually generated by flowing $H_2$ and $O_2$ into the reactor, the $O_2$ may be supplemented or substituted with another oxygen source compound, such as NO, $N_2O$, $NO_2$, $N_2O_5$, $H_2O_2$ or $O_3$. In one embodiment, $H_2$ and $N_2O$ are utilized to form a water vapor as needed. Suitable WVG systems 152 are commercially available, such as the WVG by Fujikin of America, Inc., located in Santa Clara, Calif., and the CSGS (Catalyst Steam Generator System) by Ultra Clean Technology, located in Menlo Park, Calif. It is noted that the WVG system 152 may also be any kind of equipment that capable to generate water vapor in any concentration.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 780 degrees Celsius, such as between about 150 degrees Celsius and about 550 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heating element 170 to maintain the substrate at a desired temperature.

A vacuum pump 102 is coupled to a port formed in the walls 101 of the chamber 100. The vacuum pump 102 is used to maintain a desired gas pressure in the process chamber 100. The vacuum pump 102 also evacuates post-processing gases and by-products of the process from the chamber 100.

A showerhead 120 having a plurality of apertures 128 is coupled to the top 124 of the process chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior volume 126 during process. A plasma is formed from the process gas mixture exiting the showerhead 120 to enhance thermal decomposition of the process gases resulting in the deposition of material on a surface 191 of the substrate 190.

The showerhead 120 and substrate support pedestal 150 may be formed a pair of spaced apart electrodes in the interior volume 126. One or more RF sources 140 provide a bias potential through a matching network 138 to the showerhead 120 to facilitate generation of a plasma between the showerhead 120 and the pedestal 150. Alternatively, the RF power sources 140 and matching network 138 may be coupled to the showerhead 120, substrate pedestal 150, or coupled to both the showerhead 120 and the substrate pedestal 150, or coupled to an antenna (not shown) disposed exterior to the chamber 100. In one embodiment, the RF sources 140 may provide between about 10 Watts and about 3000 Watts at a frequency of about 30 kHz to about 13.6 MHz.

The controller 110 includes a central processing unit (CPU) 112, a memory 116, and a support circuit 114 utilized to control the process sequence and regulate the gas flows from the gas panel 130 and the WVG system 152. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the control unit 110 and the various components of the processing system 132 are handled through numerous signal cables collectively referred to as signal buses 118, some of which are illustrated in FIG. 1.

Figure 2:
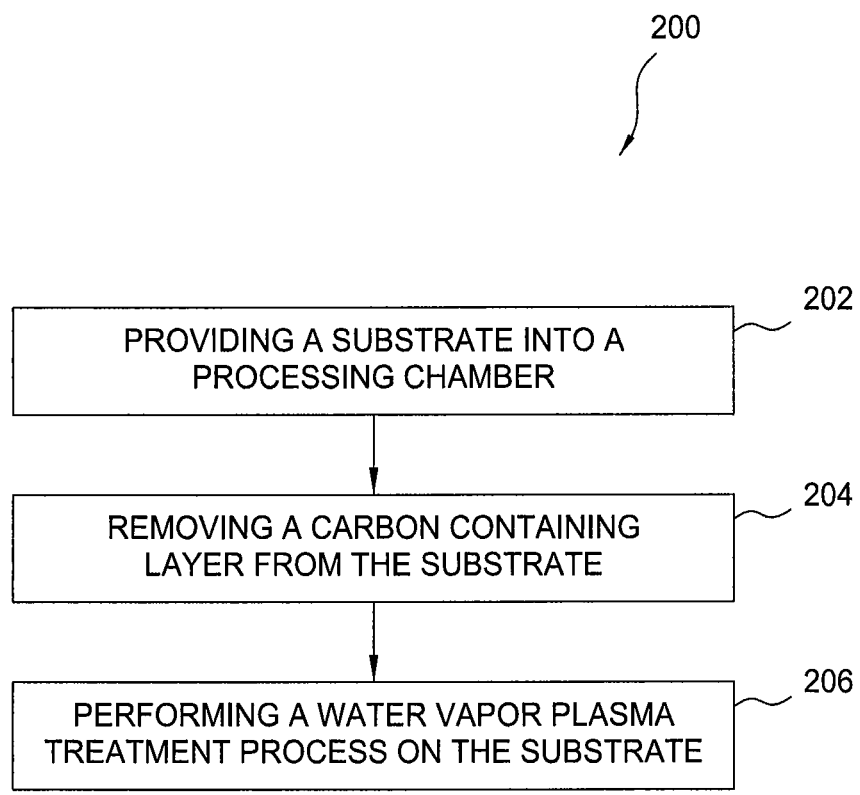
FIG. 2 depicts a flow process diagram of a cleaning process according to one embodiment of the present invention.
Figure 3A:
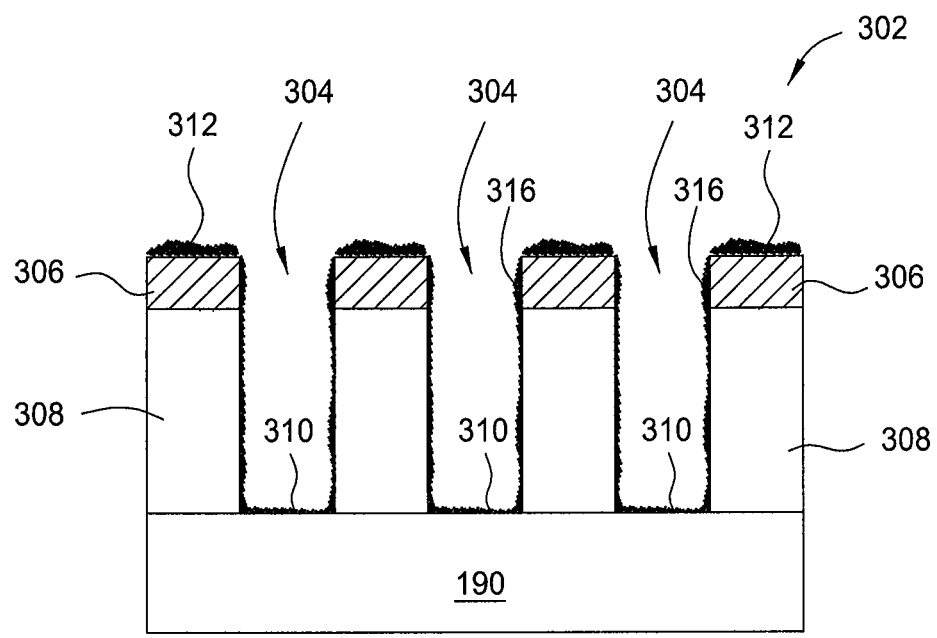
FIGS. 3A-3B depict a sequence of schematic cross-sectional views of cleaning of a substrate structure incorporating an boron-doped carbon layer according to the method of FIG. 2.
Figure 3B:
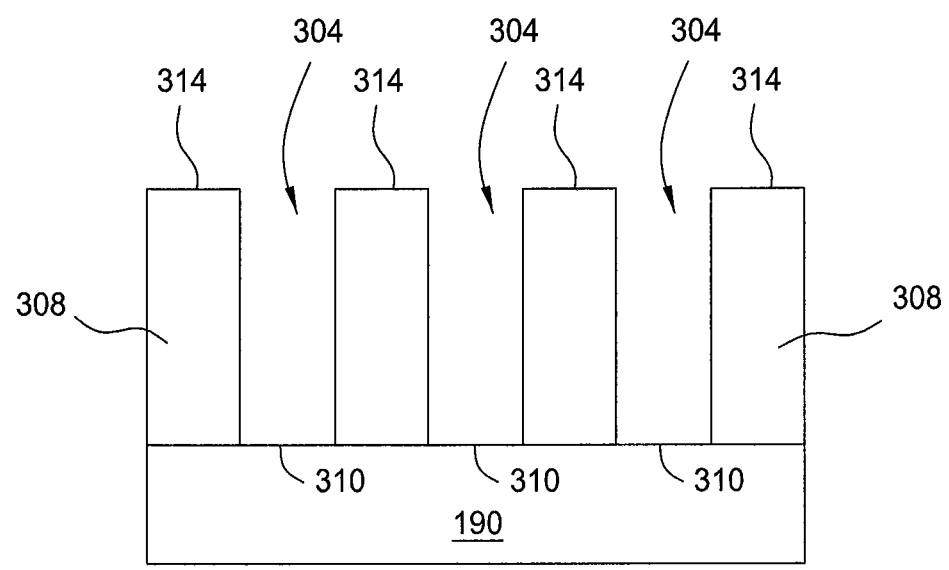

FIG. 2 illustrates a process flow diagram of a method 200 for removing a material layer disposed on a substrate according to one embodiment of the present invention. FIGS. 3A-3B are schematic cross-sectional view illustrating a sequence for removing a material layer formed on a substrate for use as a hard mask layer according to the method 200.

The method 200 begins at step 202 by providing a substrate in a process chamber, such as the substrate 190 disposed in the process system 132 as described in FIG. 1. It is contemplated that other process chambers, such as other etching chambers or deposition chambers, including those available from other manufacturers, may be utilized. The substrate 190, as shown in FIG. 3A, may have a material layer 308 disposed thereon. The substrate 190 may have a substantially planar surface, an uneven surface, or a substantially planar surface having a structure formed thereon. In one embodiment, the material layer 308 may be a part of a film stack utilized to form a gate structure, a contact structure, backend interconnection structure or shadow trench isolation (STI) structure, high-k/metal gate stack, three dimensional (3D) memory stack, or any suitable structures with high aspect ratios, odd or difficult geometries or small dimensions. In embodiments wherein the material layer 302 is not present, the structures may be directly formed in the substrate 190.

In one embodiment, the material layer 308 may be carbon-containing silicon oxides (SiOC), such as BLACK DIAMOND® dielectric material available from Applied Materials, Inc., and other low-k polymers, such as polyamides. Other suitable materials also include a silicon oxide layer, a silicon layer, a silicon oxynitride layer, or silicon nitride layer or a silicon carbide layer as needed. In yet another embodiment, the material layer 308 may include one or more layers of other dielectric materials utilized to fabricate semiconductor devices.

The material layer 308 may be patterned or etched to form openings 304 (or called vias, trenches, channels, or other suitable structures) within the material layer 308 utilizing an optional hard mask layer 306. It is noted that the term "opening" referred here includes all kinds of structures that have open areas formed therein including channels, between islands, vias, between all kinds of structures, or the like. In certain embodiment, the hard mask layer 306 may be eliminated as needed based on different process requirement. The hard mask layer 306 protects certain regions of the material layer 308 from etching while exposing other regions of the material layer 308 for etching to form the openings 304 until the underlying surface 310 of the substrate 190 is exposed. In some embodiments, a photoresist layer (not shown) may be disposed on the hard mask layer 306 to assist forming openings 304 in the material layer 308.

In one embodiment, the hard mask layer 306 is an amorphous carbon layer, a carbon containing layer, or a boron-carbon layer formed by any suitable conventional deposition techniques, such as CVD, PVD, ALD, coating, ion implantation, and the like. The boron-carbon layer contains both boron and carbon, and the atomic ratio of boron to carbon in the film is within a range of about 1:1 to about 3:1.

At step 204, after positioning the substrate on a support, carbon containing residuals 312 located on the hard mask layer 306 are removed. As discussed above, the carbon containing residuals 312 are generated on the upper surface of the hard mask layer 306 during a previously performed etching process in which the hard mask layer acts as an etching hardmask. It is noted that the carbon containing residuals 312 may also formed or present on the sidewall 316 of hard mask layer 306 or the bottom 310 of the opening 304. During the etching, the substrate and the boron-carbon hard mask layer 306 thereon are exposed to an etchant, for example, a fluorine containing gas, such as $C_4F_8$, to etch a desired pattern into the substrate. Due to polymerization of carbon and fluorine generated during the etching process, the etching process produces a carbon containing residuals, which may also include silicon and/or oxygen. The carbon containing residuals 312 is generally removed prior to the hard mask layer removal process to allow for more efficient removal of the boron-carbon hard mask layer 306.

In one embodiment, the carbon containing residuals 312 is removed from the surface of the hard mask layer 306 by exposing the carbon containing residuals 312 to a plasma formed from a fluorine-containing gas, an oxygen-containing gas, or a combination thereof. For example, the carbon containing residuals may be removed using a plasma formed from oxygen gas and $NF_3$ having a ratio of about 100:1. The amount of fluorine desired in the plasma increases with the amount of silicon present in the carbon containing residuals 312.

During the carbon containing residuals removal process, a remotely generated plasma using oxygen gas and $NF_3$ gas is provided to the process chamber at a flow rate of about 1 sccm to about 15,000 sccm per 300 millimeter substrate, for example, about 100 sccm to about 5,000 sccm. The ratio of oxygen to $NF_3$ is about 100:1 to about 1000:1. The pressure within the process chamber is maintained at a pressure within a range from about 1 millitorr to about 760 Torr, such as about 4 millitorr to about 10 Torr, while the substrate is maintained at a temperature less than 750° C. The oxygen and the $NF_3$ react with the carbon containing residuals 312 to form a volatile compound which is then exhausted from the process chamber. Under such conditions, the carbon containing residuals 312 is removed at a rate of about 2,000 angstroms per minute to about 10,000 angstroms per minute. It is contemplated that carbon containing residuals 312 may be over-etched to ensure removal from the surface of the substrate.

Figure 4A:
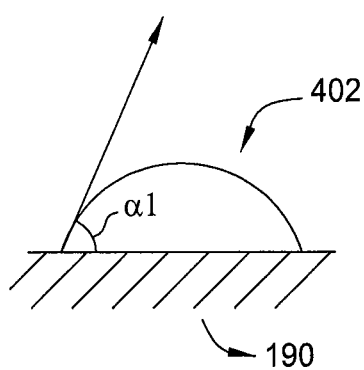
FIG. 4A-4B are cross sectional views of substrate surfaces having different wetting angles in contact with different liquid precursors according to one embodiment of the invention.
Figure 4B:
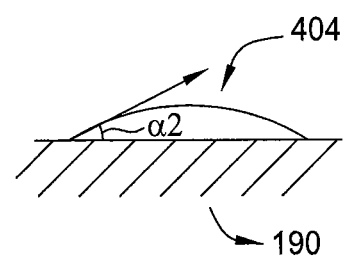

At step 206, after removal of the carbon containing residuals 312 from the substrate 190, the hard mask layer 306 is then removed by performing a water vapor plasma treatment process on the substrate 190, as shown in FIG. 3B. The water vapor generated in the plasma treatment may efficiently form oxidizer (O—), reducer (H—), and hydroxyl groups (OH). It is believed that oxygen oxidizer can react with the carbon element from the hard mask layer to form a volatile compound (e.g., $CO_2$) which may be exhausted from the chamber while the hydrogen reducer may react with the boron, if any, in the hard mask 306 layer to form a volatile compound (e.g., $B_2H_6$) which is then exhausted from the chamber. The hydroxyl groups (OH) and $H_2O$ element provided from the water vapor can efficiently modify the surface properties along with the removal process, so as to efficiently assist reducer and oxidizer from the hydroxyl groups to continue immersing and absorbing into the hard mask layer and enhance continuation of the removal process. For example, it is believed that hydroxyl groups may efficiently alter the surface wetting performance along the hard mask layer removal process, thereby efficiently providing a surface with different wetting ability. It is believed that the hydroxyl groups can reduce the wetting angle when reacting with the hard mask layer 306, thereby resulting in the film surface becoming more hydrophilic to assist removing carbon elements from the substrate surface. A hydrophilic surface may assist the hydrogen or oxygen ions from the water vapor plasma to penetrate into the hard mask layer, thereby efficiently dissociating the hard mask layer and removing thereof from the substrate surface. In the embodiment depicted in FIGS. 4A and 4B, a first liquid precursor 402 having a high wetting angle, $\alpha 1$, (e.g., a hydrophobic surface) to a substrate surface 190, as shown in FIG. 4A, would result in the first liquid precursor 402 to accumulate and aggregate on the substrate surface 190, rather than absorbing or penetrating into the substrate surface 190 to react with the elements in the film layer disposed on the substrate surface 190. In contract, a second liquid precursor 404 having a low wetting angle, $\alpha 2$, (e.g., a hydrophilic surface) to a substrate surface 190, as shown in FIG. 4B, will assist the second liquid precursor 404 to react, absorb, and penetrate into the film layer disposed on the substrate 190, thereby efficiently improving element reactions between the second liquid precursor 404 and the substrate surface so as to remove such film layer from the substrate surface. Therefore, by using the water vapor plasma process to remove the hard mask layer 306, the water vapor plasma can efficiently make the hard mask layer 306 with a hydrophilic surface, thereby efficiently improving cleaning and/or removal efficiency of the hard mask layer 306.

In one embodiment, the wetting angle of the precursor to the substrate surface (e.g., the surface wetting angle controlled when exposing to the water vapor plasma) may be controlled at about less than 40 degrees, such as between about 0 degree and about 40 degree so as to maintain good film removal efficiency.

Furthermore, it is also believed that controlling the process pressure at a median pressure regime, such as between about 1 Torr and about 120 Torr, may also assist resulting in the substrate surface where the patterns are formed in a more hydrophilic surface, thereby assisting cleaning and/or removal efficiency of the hard mask layer 306. It is believed that the median pressure regime during processing may assist control the process condition in a desired manner. In one embodiment, the process pressure controlled during the water vapor plasma treatment process is 1 Torr and about 120 Torr, such as between about 20 Torr and about 100 Torr. In an exemplary embodiment wherein the water vapor plasma removal is performed on the hard mask layer 306, the process pressure may be controlled at between about 40 Torr and about 70 Torr. In another exemplary embodiment wherein the water vapor plasma treatment process is performed on a silicon containing layer, such as a silicon oxide layer, for example a silicon oxide layer in a contact structure, the process pressure may be controlled at between about 1 Torr and about 7 Torr.

In operation, several process parameters may also be controlled. In one example, the water vapor may be generated and supplied into the process chamber in either a continuous mode or in a pulsed mode. In one embodiment, the water vapor may be generated in a continuous mode into the process chamber at a flow rate between about 5 sccm and about 30000 sccm. A RF power may be supplied into the process chamber between about 5 Watts and about 5000 Watts to dissociate the water vapor for reaction. The chamber process may be controlled at less than about 760 Torr, such as between about 1 Torr and about 150 Torr. The substrate temperature may be controlled at about 0 degrees Celsius and about 760 degrees Celsius. The substrate may be exposed to the water vapor plasma at between about 1 seconds and about 36000 seconds.

In the embodiment wherein the water vapor is supplied into the process chamber in a pulsed mode, the water vapor may be pulsed into the process at about every 60 seconds for lasting about 30 seconds. The duty cycles may be controlled at about 1 percent and about 100 percent as needed.

In addition, while performing the water vapor plasma treatment process at step 206, other different gas sources may also be supplied into the process chamber to enhance the reaction efficiency. In one example, the water vapor contains water and further $O_2$ gas. In another example, the water vapor contains water and further $H_2$ gas. In yet another embodiment, the water vapor contains water and further $O_2$ and $H_2$ gas as needed. The addition of hydrogen has been found to increase the removal rate of the hard mask layer 306, especially in boron-carbon hard mask layer 306 containing a higher concentration of boron as compared to carbon. The addition of other carrier gases, such as helium, argon or nitrogen, has been observed to lower the rate of removal of the boron-carbon hard mask layer 306, while simultaneously improving etch uniformity. In another embodiment, it is contemplated that the water vapor may be used to remove a carbon film, such as amorphous carbon, containing substantially no boron. Alternatively, it is contemplated that the water vapor may be used to strip a boron film, such as amorphous boron, containing substantially no carbon.

In the embodiment wherein an oxygen containing gas may also be supplied with the water vapor into the process chamber to perform the plasma treatment process, it is contemplated that any compound which provides oxygen, such as $O_2$, $N_2O$, $CO_2$, NO, or $NO_2$, may be used and supplied with the water vapor at step 206 to perform the boron-carbon hard mask layer removal process. In the embodiment wherein a hydrogen containing gas may also be supplied with the water vapor into the process chamber to perform the plasma treatment process, it is contemplated that any compound which provides hydrogen, such as $H_2$, $NH_3$ or $H_2O_2$ may be used at step 206. It is noted that not only a hard mask layer would be the target material to be removed in this water vapor plasma treatment process, but also all other etching residuals that may be formed during etching remaining on the structures in a semiconductor device, such as a contact structures, metal gate structures, or metal contact structures, may also be removed or cleaned using this water vapor plasma treatment process as needed.

In one embodiment, it is contemplated that non-stoichiometric combinations of oxygen and hydrogen (e.g., $H_xO_y$, where x and y may be integers or non-integers both greater than 1) including $H_2O_2$ may be input to or generated by the WVG system 152. In such an embodiment, some hydrogen peroxide may be generated by the WVG system 152. In another embodiment, it is contemplated that oxygen gas, helium gas, nitrogen gas, argon gas, nitrous oxide gas, and or/hydrogen gas may be provided to the process gas in addition to water vapor as needed.

In one embodiment, when generating a capacitively coupled water vapor plasma, the spacing between the substrate 190 and a showerhead 120 located within the chamber may be within a range of about 20 mils to about 600 mils. Reduced spacing between the substrate is beneficial when processing substrates in larger volumes (for example, when processing large area substrates) under higher pressures (for example, greater than about 7 Torr). When processing substrates at pressures greater than about 7 Torr, the reduced spacing facilitates plasma sustainability. In one example, when processing a substrate at about 30 Torr, the spacing between the substrate and the face plate may be about 300 mils. At 40 Torr, the spacing between the substrate and the face plate may be within a range of about 240 mils to about 270 mils. At a pressure of about 50 Torr, the spacing between the substrate and the face plate may be less than 200 mils.

It is noted that the carbon containing residuals removal process performed at step 204 may be executed in the same chamber as the chamber configured to remove the hard mask layer 306 as described at step 206. In another embodiment, it is contemplated that the step 204 may occur in a separate chamber, such as an etching chamber, and may occur before positioning the substrate in a process chamber for performing the hard mask layer 306 removal process at step 206. It is also noted that the process at step 204 may be simultaneously occurred with the process at step 206. In another words, when a water vapor plasma treatment is performed in the processing chamber, not only the hard mask layer 306 is removed (described at step 206), but also the carbon containing residuals or byproducts (described at step 204) may be removed. Accordingly, by performing one water vapor plasma process, both the carbon containing residuals or byproducts (described at step 204) and the hard mask layer 306 (described at step 206) can be removed simultaneously.

In one embodiment, it is contemplated that the plasma of step 204 and water vapor plasma process at step 206 can be a capacitively coupled or inductively coupled in addition to or as an alternative to a remotely generated. For example, it is contemplated that a capacitively coupled plasma may be generated from a water vapor and an inert gas. The water vapor may be introduced to the chamber at a flow rate between about 5 sccm and 3000 sccm, such as about 4,000 SCCM. The inert gas, such as Ar or He, may be provided to the chamber at a flow rate of between about 5 sccm and about 3000 sccm, such as about 1000 sccm. In another embodiment, it is contemplated that the water vapor may be generated via in situ steam generation as needed.

In the embodiment wherein a boron-carbon layer and/or a photoresist layer having dopants doped after an ion implantation process, the water vapor plasma process 200 may also be utilized to clean or remove such layer as needed.

Figure 5:
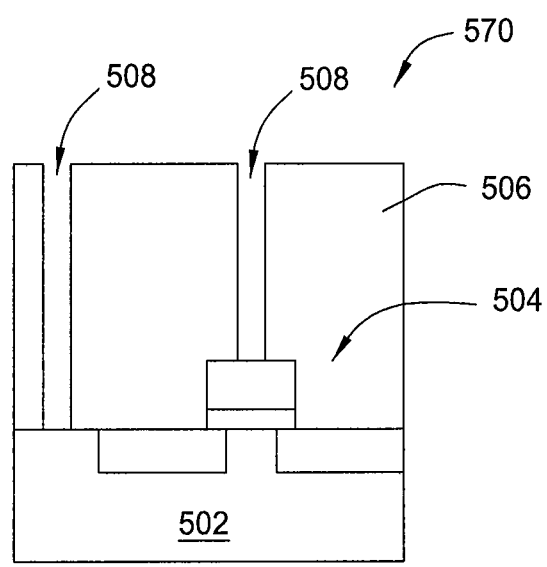
FIG. 5 is a cross-sectional view of a composite structure having high aspect ratio features formed in a contact structure for field effect transistors that may have a water vapor plasma treatment process performed thereon.

In one embodiment, the water vapor plasma process 200 may be utilized to clean a contact structure 570 having features 508 with aspect ratios greater than about 20:1, such as about 100:1, formed in a dielectric layer 506 as a contact structure disposed on field effect transistors 504 on a substrate 502, as shown in FIG. 5. The dielectric layer 506 may be a silicon oxide containing layer. Other suitable materials for the dielectric layer 506 include undoped silicon glass (USG), such as silicon oxide or TEOS, boron-silicate glass (BSG), phosphorus-silicate glass (PSG), boron-phosphorussilicate glass (BPSG) and combinations thereof. In an exemplary embodiment depicted herein, the dielectric layer 506 is an undoped silicon glass (USG) layer. In one embodiment, the dielectric layer 506 has a thickness between about 3000 Å to about 15000 Å, such as between about 4000 Å to about 12000 Å, for example about 10000 Å. Furthermore, the water vapor plasma may also utilize to clean the surface of the dielectric layer 506 as well as the surfaces of the field effect transistors 504 disposed on the contact structures 501, which often are metal silicide layer selected from a group consisting of nickel silicide, cobalt silicide, tungsten silicide, tantalum silicide, titanium silicide, and other suitable metal silicide materials. In some embodiment, the metal silicide layer may have a silicon nitride layer disposed thereon as a etch stop layer. As the features 508 formed in the dielectric layer 506 may have even higher aspect ratio or with geometry difficult to clean, by using water vapor plasma treatment process, the water vapor may be supplied further down to the feature bottom (e.g., via/trench bottom) to clean the substrate surface prior to the subsequent metal deposition process, such as a contact pre-cleaning process or post-etch residual clean. It is believed that water vapor as supplied in the plasma treatment process may have minimal metal oxidation effect, thereby maintaining a low contact resistance surface readily to have subsequent metal layer formed thereon to complete the contact structure.

After the surface pre-cleaning process, the features 508 may be later filled or deposited with metal materials to form interconnection structure on the substrate in subsequent processes. Examples of metal materials include tungsten (W), tungsten nitride (WN), copper (Cu), titanium (Ti), tantalum (Ta), aluminum (Al), titanium nitride (TiN), tantalum nitride (TaN) or the like. Alternatively, the process 200 may be used to clean or remove other structures, such as metal gate structures or any other suitable structures, and some non-metal contaminations such as fluorine, chlorine, and sulfur contaminations as needed. In yet another embodiment, the process 200 may be used to do surface passivation, chamber wall passivation or surface treatment to alert surface wetting angle within a desired range as needed. In the embodiment wherein the chamber wall includes Al2O3, the process 200 may be performed to protect chamber interior from harsh chemicals, such as fluorine elements. The process 200 further may also use to clean substrate bevel strip, including the substrate bevel removal process with boron film, carbon film, or boron and carbon containing film residuals.

It is noted that in some instances wherein a processing chamber wall including all kinds of processing chamber, such as deposition chamber and etching chamber, may have boron-carbon layer built-up, carbon layer built-up, or boron layer built-up or other accumulation after cycles of boron-carbon layer, carbon layer or boron layer deposition processes, the water vapor plasma process 200 may also be utilized to clean or remove such layer as needed. Additionally, the water vapor plasma process 200 may also assist chamber wall passivation or provide chamber wall protection after cycles of etching processes or deposition processes.

Benefits of the methods described herein include removing a material layer or cleaning or a substrate surface without damaging materials or underlying metal layers located on a substrate. The removal and/or cleaning methods allow for etching rate, as well as etching uniformity to be controlled by varying plasma composition. It is noted that the water vapor plasma treatment process as described here may also be utilized to clean a substrate surface with any materials as needed.

While the foregoing is directed to embodiments of the present invention, other and further embodiments of the invention may be devised without departing from the basic scope thereof, and the scope thereof is determined by the claims that follow.

We claim:

1. A method for cleaning a surface of a substrate, comprising:
    positioning a substrate into a processing chamber, the substrate having a dielectric layer disposed thereon and openings defined in the dielectric layer disposed on the substrate, wherein the openings expose a contact structure including at least a contact metal, a contact metal silicide layer or a contact silicon nitride layer formed on the substrate and the openings have aspect ratio greater than 20:1;
    supplying water vapor to the dielectric layer disposed on the substrate and the openings formed in the dielectric layer in the chamber to form a plasma in the water vapor;
    maintaining a process pressure in the chamber at between about 40 Torr and 70 Torr while supplying the water vapor to the dielectric layer; and
    cleaning the dielectric layer disposed on the substrate by the plasma formed from the water vapor.

2. The method of claim 1, wherein the dielectric layer used to form the contact structure is selected from a group consisting of undoped silicon glass (USG), boron-silicate glass (BSG), phosphorus-silicate glass (PSG), boron-phosphorus-silicate glass (BPSG) and combinations thereof.

3. The method of claim 1, wherein supplying the water vapor further comprising:
    altering a surface of the dielectric layer to form a hydrophilic surface having a wetting angle less than about 40 degrees.

4. The method of claim 1, wherein supplying the water vapor further comprising:
    supplying an oxygen containing gas or a hydrogen containing gas with the water vapor into the chamber.

5. The method of claim 1, wherein supplying the water vapor further comprises:
    applying a RF power between about 5 watts and about 5000 watts to form the plasma in the water vapor.

6. The method of claim 1, wherein supplying the water vapor further comprises:
    exposing the dielectric layer to a carbon-fluorine containing gas prior to exposing to the water vapor.

7. The method of claim 1, wherein the water vapor is generated in the presence of argon, helium, or nitrogen.

8. The method of claim 1, wherein supplying the water vapor further comprises:
    supplying the water vapor to the chamber in a pulsed mode.

9. The method of claim 1, further comprising:
    controlling the substrate temperature at between about 0 degrees Celsius and about 760 degrees Celsius.

10. The method of claim 1, wherein the contact metal, contact metal silicide layer or contact silicon nitride layer are utilized in field effect transistors.

11. The method of claim 10, wherein the water vapor supplied to the chamber cleans the contact metal or contact metal silicide layer or contact silicon nitride layer as well as the dielectric layer disposed on the substrate.

* * * * *